US007009210B2

(12) United States Patent
Sarathy et al.

(10) Patent No.: US 7,009,210 B2
(45) Date of Patent: Mar. 7, 2006

(54) METHOD AND APPARATUS FOR BIT-RATE AND FORMAT INSENSITIVE PERFORMANCE MONITORING OF LIGHTWAVE SIGNALS

(75) Inventors: Jithamithra Sarathy, Eatontown, NJ (US); Chinnabbu Ekambaram, Freehold, NJ (US); David Lidsky, Sea Bright, NJ (US); Bharat Dave, Howell, NJ (US); Boris Stefanov, Gillette, NJ (US); Tan B. Thai, Jackson, NJ (US); Ronald Simprini, Red Bank, NJ (US); Julio Martinez, Oakhurst, NJ (US); Gaurav Naik, Eatontown, NJ (US)

(73) Assignee: Alphion Corporation, Eatontown, NJ (US)

( * ) Notice: Subject to any disclaimer, the term of this patent is extended or adjusted under 35 U.S.C. 154(b) by 794 days.

(21) Appl. No.: 09/852,582

(22) Filed: May 9, 2001

(65) Prior Publication Data
US 2002/0053677 A1  May 9, 2002

Related U.S. Application Data

(60) Provisional application No. 60/238,295, filed on Oct. 6, 2000.

(51) Int. Cl.
*H01L 27/15* (2006.01)
*H01L 33/00* (2006.01)
(52) U.S. Cl. .............................. 257/98; 257/79; 257/21; 257/84; 257/85; 257/432; 257/458; 257/184; 359/248
(58) Field of Classification Search ............... 257/79, 257/98, 21, 84, 85, 432, 436, 458, 184; 359/248
See application file for complete search history.

(56) References Cited

U.S. PATENT DOCUMENTS

| 5,051,790 | A | * | 9/1991 | Hammer | 357/19 |
| 5,281,829 | A | * | 1/1994 | Chinen | 257/80 |
| 5,689,122 | A | * | 11/1997 | Chandrasekhar | 257/184 |
| 5,737,474 | A | * | 4/1998 | Aoki et al. | 385/131 |
| 5,760,419 | A | * | 6/1998 | Nabiev et al. | 257/21 |
| 5,946,336 | A | * | 8/1999 | Mizutani et al. | 372/50 |
| 6,157,037 | A | * | 12/2000 | Danielson | 250/458.1 |
| 6,252,895 | B1 | * | 6/2001 | Nitta et al. | 372/50 |
| 6,331,832 | B1 | * | 12/2001 | Rushing | 341/139 |
| 6,373,872 | B1 | * | 4/2002 | Deacon | 372/34 |

FOREIGN PATENT DOCUMENTS

JP          363111679 A    *    5/1988

* cited by examiner

*Primary Examiner*—Tom Thomas
*Assistant Examiner*—Joseph Nguyen
(74) *Attorney, Agent, or Firm*—Kaplan Gilman Gibson & Dernier LLP

(57) ABSTRACT

A method and apparatus for a tunable optical spectrum analyzer that can measure the optical spectrum of a demultiplexed DWDM signal are presented. The signal level and Optical Signal to Noise Ratio (OSNR) of an individual channel of the DWDM signal can be obtained from the measured optical spectrum. The device employs a rapid tuning and detection technique to obtain the optical spectrum of the incoming signal. In a preferred embodiment the apparatus is fabricated on a single chip resulting in a compact measurement device. Using the device of the preferred embodiment, single channel OSNR can be determined in as small a time interval as approximately 225 microseconds. Using an array of these devices an entire DWDM mixed signal can be monitored as to OP and OSNR in the same time interval.

12 Claims, 6 Drawing Sheets

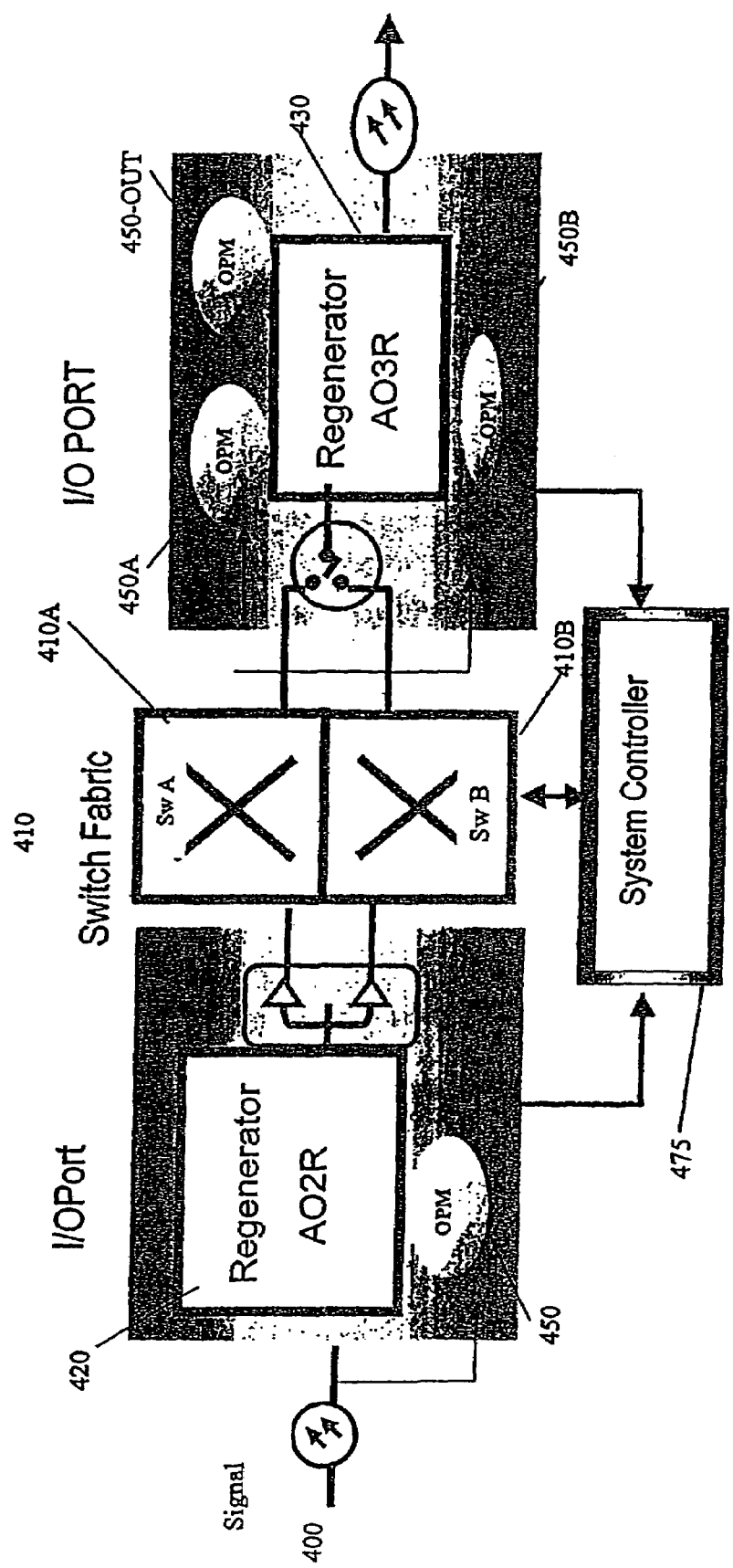

US 7,009,210 B2

METHOD AND APPARATUS FOR BIT-RATE AND FORMAT INSENSITIVE PERFORMANCE MONITORING OF LIGHTWAVE SIGNALS

CROSS REFERENCE TO RELATED APPLICATIONS

This application claims priority of U.S. Provisional Patent Application Ser. No. 60/238,295, filed on Oct. 6, 2000.

TECHNICAL FIELD

This invention relates to telecommunications, and more specifically, to an improved method and apparatus for the monitoring of the performance of optical signals in optical data networks.

BACKGROUND OF THE INVENTION

Optical communications networks are becoming more and more prevalent. This is because they facilitate high bandwidth long haul connections among nodes in a data network. All "optical networks" currently operating, whether commercially or merely for research purposes, transmit data signals which in actuality are converted from the optical to the electrical domains at some point in the routing, switching, processing or transmission of the data signals. The more that the data signals can be routed, switched, processed and transmitted in the optical domain, the better the overall benefit to system efficiency in terms of conversion losses and throughput potential. Thus the future looms brightly for all optical data networks.

In order to accurately monitor and maintain system performance, such a system must have a means of measuring and monitoring the optical signals managed by it. The system must regularly monitor certain performance parameters of the optical signals to determine overall signal strength, and the information content of these signals. As well, since many optical data network topologies utilize redundancy as a fail-safe and backup strategy, the optical signal is often monitored at the input and output ports of various system components and used as a means to choose which of two redundant components will carry the actual signal.

In light of the above discussion, the Optical Power (OP) and the Optical Signal to Noise Ratio (OSNR) of a given service wavelength are two key Optical Performance Monitoring (OPM) parameters that need to be measured in optical networks. These measurements facilitate service maintenance as well as fault isolation in optical networks.

In order to increase the data traffic that can be carried on a given physical fiber, modern optical communications systems utilize Dense Wave Division Multiplexing, or DWDM. This is a technique whereby many different optical wavelengths, each carrying its own signal, are combined for transport, and are demultiplexed at network nodes for routing and other processing. DWDM has thus become a mainstay technology for multiplying the available bandwidth in optical systems. Current optical communications systems measure the OP and OSNR on the multiplexed signal. This method, which must acquire information from a band-wide signal (such as the currently utilized 1529 nm to 1562 nm wavelength range) takes time. As well, current OPM devices also use discrete components, and, as a result, the overall device sizes range in centimeters or inches. This size is cumbersome. Further, these OPM devices are incapable of integration with other network nodal circuitry on one chip or substrate, and the results of optical performance measurement are not as immediately available to the control circuitry as they could be if the signal was merely being sent from one part of an integrated device to another.

Additionally, the present embodiments of such measurement schemes are slow in speed (typically 100 msec to 2 sec scan time) relative to the data rates. Thus, if failure detection is dependent upon optical performance measurement, much data will be lost before a failure can even be detected. As data rates continue to migrate higher, this effect becomes more and more pronounced. For example, at the OC-768 data rate of 40 Gb/s, 5 Megabytes of data are lost before the failure can even be detected.

What is thus needed is an optical performance measurement device with increased acquisition speed and greater compactness, allowing a more efficient optical characterization of DWDM signals.

What is further needed is an optical performance measurement device that is small enough to be integrated with other network circuitry, thus increasing the speed of availability of performance information to decision and monitoring circuitry, as well as allowing the fuller integration and miniaturization of optical network node functionalities.

SUMMARY OF THE INVENTION

A method and apparatus are presented for a tunable device for measuring the optical spectrum of a DWDM signal on a per channel basis. The device is an InP-semiconductor based tunable photodiode. In a preferred embodiment, the typical size of the chip is approximately 500 $\mu$m×100 $\mu$m. The device includes a grating reflector along the entire length, a phase tuning section and an absorption section. The grating serves to narrow the spectral width of the resonanant core. The 3 dB bandwidth of the cavity is approximately 0.1 nm. The selected wavelength can be adjusted by injecting current into the tuning section. The photocurrent from each 0.1 nm slice of the spectrum is converted into a voltage and the OSNR is calculated therefrom in a simple way. The measured peak power indicates the optical power in the signal.

In a preferred embodiment, the device can measure the optical power and OSNR of any of the individual channels of a DWDM signal, with a single channel measurement time of approximately 225 microseconds.

BRIEF DESCRIPTION OF THE DRAWINGS

FIG. 4 depicts an exemplary system utilizing the device of the invention.

DETAILED DESCRIPTION OF THE PREFERRED EMBODIMENTS

Device Description

Figure 1:
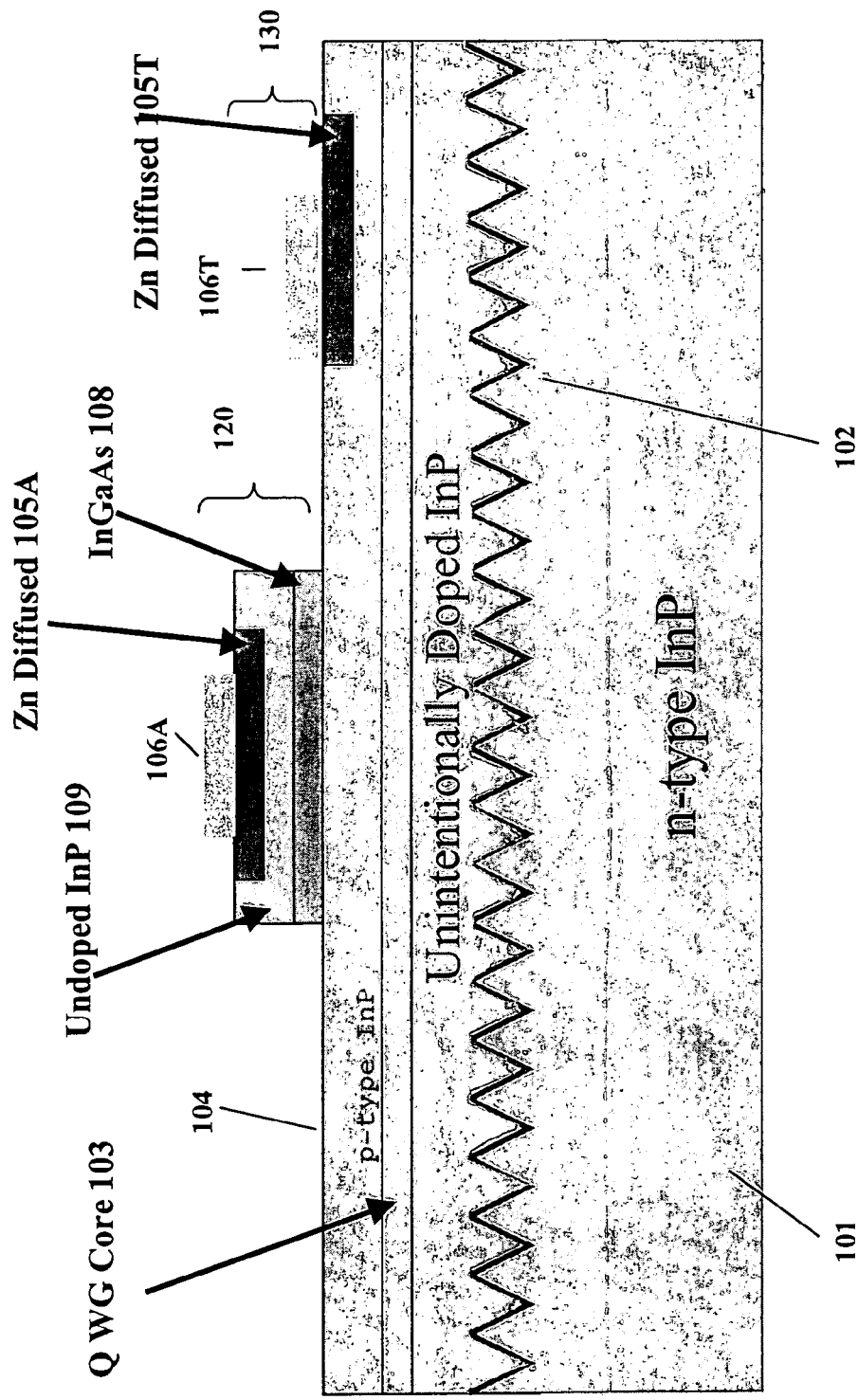
FIG. 1 depicts a schematic cross section of the 3-section tunable photodetector device of a preferred embodiment of the invention.

The physical structure of the device of a preferred embodiment of the present invention will now be described with reference to FIG. 1 The device is a semiconductor photodetector, and consists of a buried grating, a waveguide core, the absorption section, and the tuning section. The device is constructed on an n-type InP substrate 101. The waveguide section 103 guides the incoming light waves, and consists of an InGaAsP ($\lambda_g$=1.17 μm) waveguide 103. An undoped InP region 102 lies underneath the waveguide, which acquires some doping nonetheless by diffusion from the n-type InP region, and can thus be more precisely termed the "unintentionally doped InP region." A first order grating of periodicity approximating 2850 A 110 is positioned between the substrate 101 and the undoped InP 102 regions. This grating reflects only those wavelengths within +/−0.1 mn of the Bragg wavelength.

Above the waveguide is a p-type InP region 104, into which, at the top right of the depicted device, is a zinc diffusion region 105T. Above the zinc diffusion region 105T is an electrical contact 106T. These latter two structures comprise the tuning section of the device 130, and electrical tuning current is thus injected via the tuning electrode 106T to select a particular wavelength.

At the top center of the device is depicted the absorption section 120. This section is comprised of an InGaAs semiconductor absorption layer 108, which is disposed above the p-type InP region 104. Above the InGaAs absorption layer 108 is disposed another undoped InP layer 109, into which a zinc diffusion 105A is disposed. Above the zinc diffusion region 105A an electrical contact 106A is deposited. The photocurrent from the absorption section of the device 120 is communicated to other apparatus via this contact.

The InGaAs absorption region 108 and the tuning section of the photodetector are formed from the epilayer by photolithography and chemical etching. The p-type InP top cladding layer 104 is regrown and electrical contacts 106A and 106T are metallized, respectively, for the absorption and tuning sections of the device. The dimensions of the described preferred embodiment device, for example, are approximately 500 μm×100 μm, it being understood that various other dimensionalities are included within the apparatus of the invention.

Device Operation

The operation of the device is as follows. An optical signal, such as, for example, a single channel of a DWDM signal, is coupled into the waveguide 103 of the device. The evanescent tail of the guided electric field overlaps the absorption region of the device. The light, coupled into the guided mode and absorbed from this evanescent field, is seen as a photocurrent. The light traveling down the core of the waveguide 103 is partially back-reflected through second-order diffraction by the grating region 110 on the other side of the waveguide 103 from the absorption region 108. This back-reflection provides the feedback necessary to establish resonance in the cavity. The grating reflector is designed such that the 3 dB spectral width of the photodetector response for any given tuning condition is 0.1 nm. The tuning junction changes the effective index of the guided mode in this region. Consequently, the spectrum of back-reflected light is shifted in the direction of refractive index change. This change in the cavity resonance can be observed in the wavelength spectrum of the photo response in the detection junction.

Since the InGaAs absorption layer 108 has an index of refraction higher than that of the core 103, a small part of the energy in the tail of the mode will leak into the absorption layer 108. The leakage will be large enough for detection, yet small enough to preserve tuning precision. The observed energy is further amplified and measured as described below.

The tuning mechanism is similar to that in a standard Distributed Bragg Reflector (DBR) laser. By varying the tuning current, a 3 dB bandwidth of 0.1 nm from the measured wavelength can be achieved. The tuning current changes the effective index of the grating 110, shifting the frequency of maximum reflection. By setting the tuning current appropriately, a single mode at any desired frequency (within the frequency of operation) can be isolated.

Figure 2:
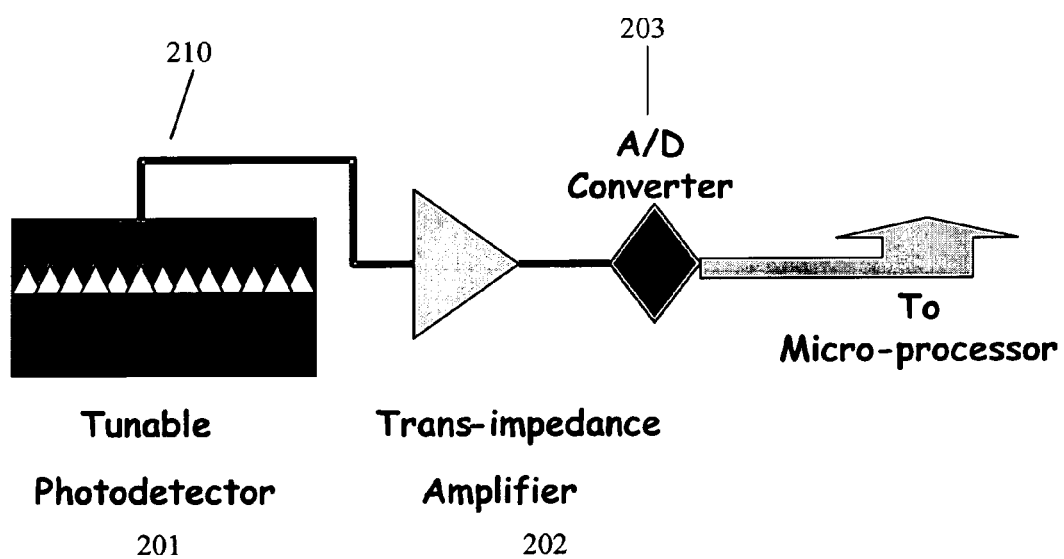
FIG. 2 depicts the signal pathway of the photocurrent obtained using the method of the invention.
Figure 3:
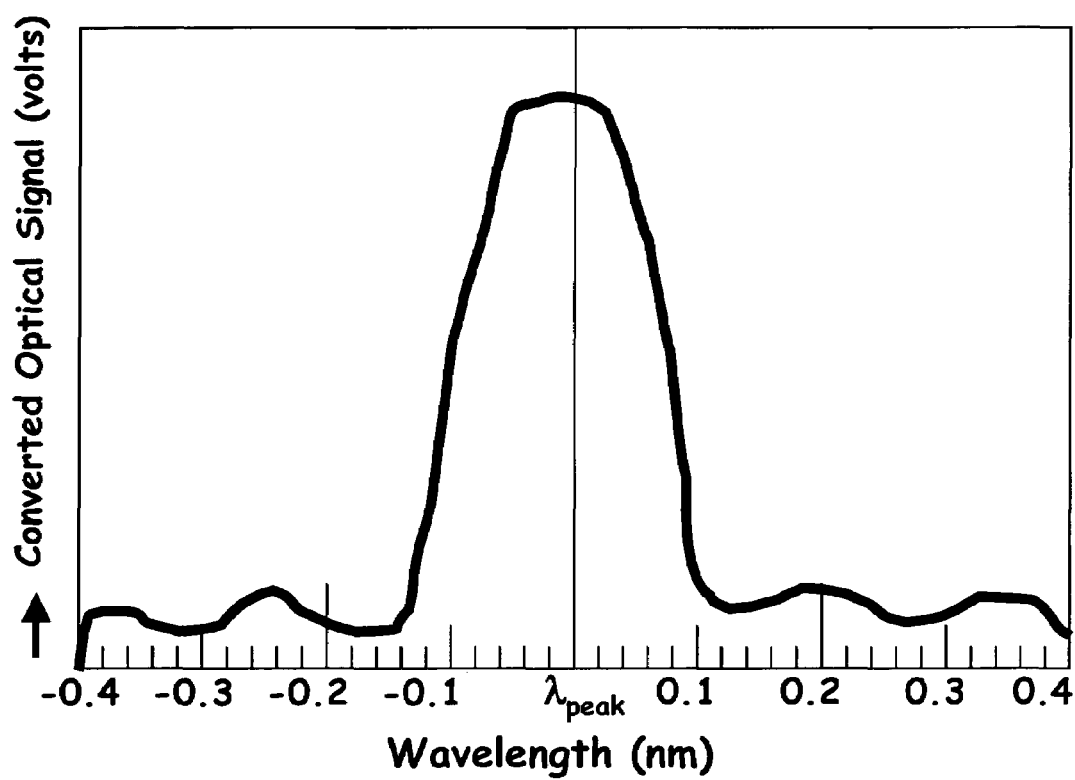
FIG. 3 depicts the bandwidth of the measured signal using the method of the invention.
Figure 3A:
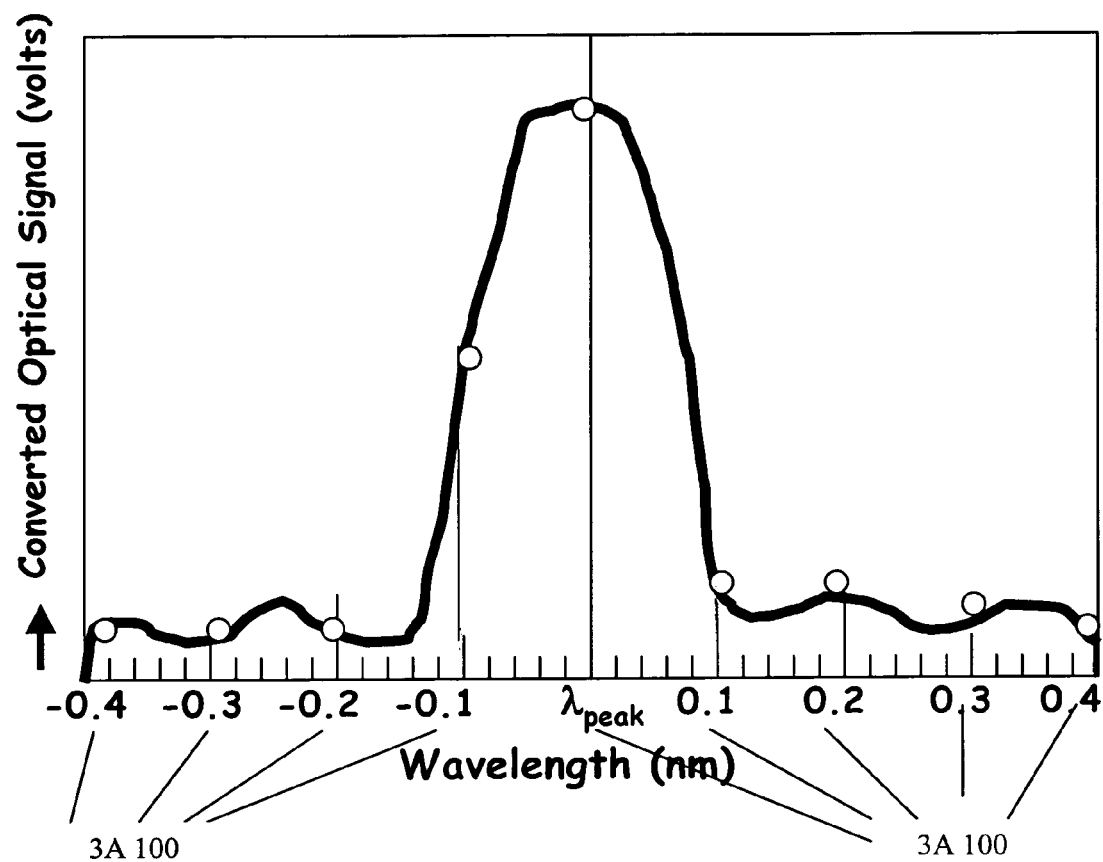
FIG. 3A depicts exemplary sample points taken in a typical measurement.
Figure 3B:
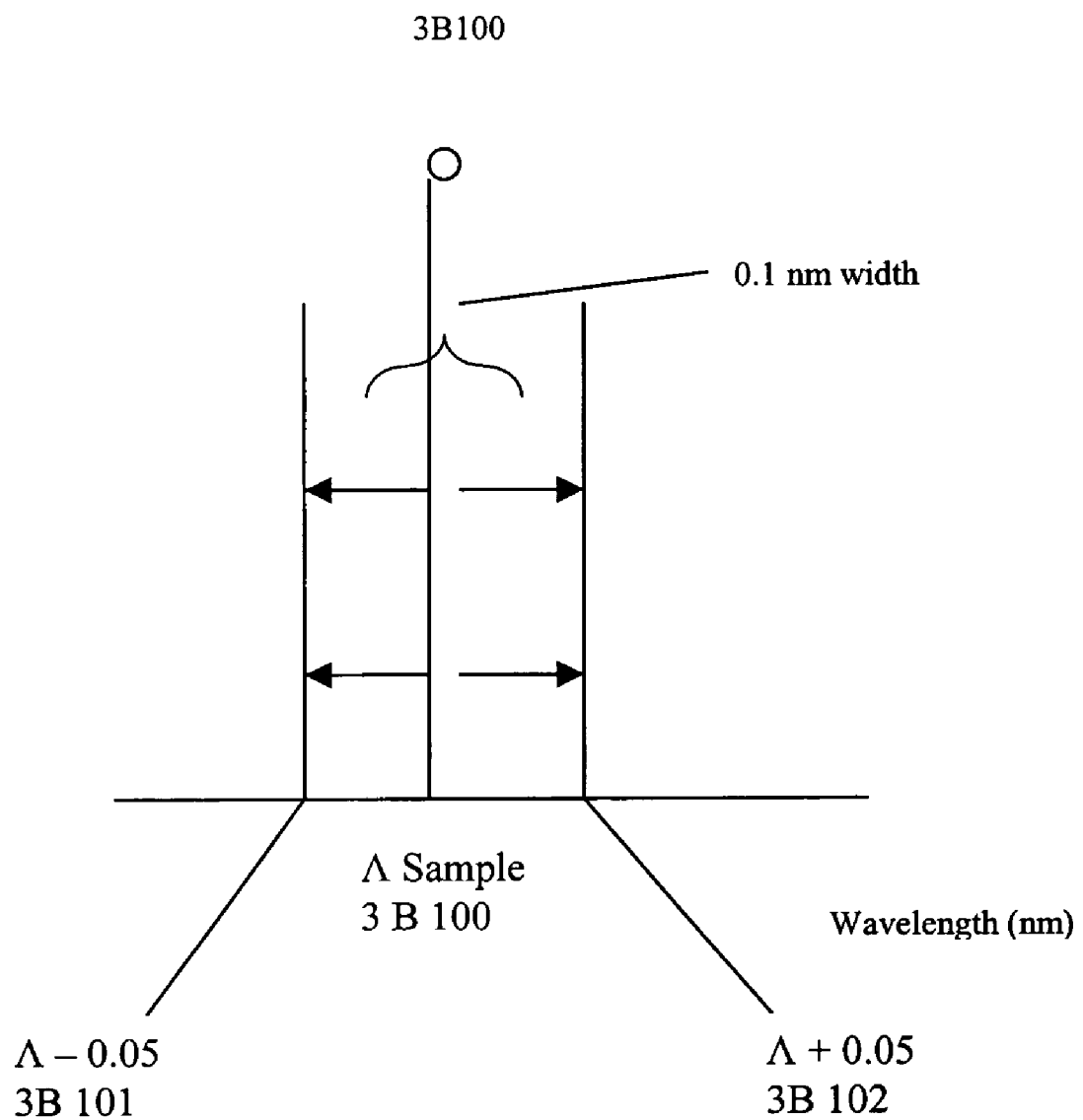
FIG. 3B depicts an exemplary wavelength spectrum measured at one of the exemplary sample points depicted in FIG. 3A.

The performance monitor signal can be generated from the photocurrent using an exemplary scheme as shown in FIG. 2. The optical power in the 0.1 nm slice of the input spectrum is directly proportional to the photocurrent 210 generated in the absorption section of the device, and communicated out of the device via the electrode 106A, as described above. The photocurrent 210 is amplified using a trans-impedance amplifier 202 which converts the photocurrent into a voltage. This voltage is digitized by the A/D converter 203, and read using a micro-controller (not shown in FIG. 2). The micro-controller outputs the corresponding tuning current values to obtain the optical spectrum of the incoming signal The OSNR is measured by measuring the optical spectrum of the DWDM signal of a single or multiple channels. A schematic diagram of an exemplary measured optical spectrum is shown in FIG. 3. This is a measurement to find the signal strength and power at a certain wavelength serviced in the optical network. Since the 3 dB bandwidth of the photodetector is 0.1 nm, and the range to be measured is the desired wavelength +/− 0.45 nm, 9 sample points of the spectrum are used to measure the OSNR when the DWDM spectral separation is 100 GHz. The various 9 sample points 3A100 in such an exemplary measurement are depicted in FIG. 3A, where the samples are taken centered at each of the spectral points λ+/−N nm, where N={4, 3, 2, 1, 0}. Taking measurements centered at each of these sample points results in a measured spectrum from λ−0.45 nm to λ+0.45 nm, where λ is the wavelength in question, as is depicted in FIG. 3B. This is due to the fact that the photodetector 3 dB bandwidth being 0.1 nm, at each measured sample a 0.1 nm swath of wavelengths is actually being measured, with its center at the nominal sample point. In other words, since the 3 dB bandwidth of the photodetector is 0.1 nm, centering it at a given sample point λ sample 3B100 will sweep the wavelengths in the range sample point +/−0.05 nm, i.e. from λ−0.5 nm 3B101 through λ+0.5 nm 3B102.

Assume, for example, that the optical network utilizes the "C" band of frequencies, or those frequencies near 1550 nm. It is noted that for frequencies near 1550 nm a 100 GHz distance in the frequency domain translates to a 1.0 nm distance in wavelength. Thus, with a spectral separation of 100 GHz between carrier frequencies, the wavelength separation between any two carrier wavelengths (in the 1550 nm band, commonly known as the "C" band) will be 1.0 nm. Sweeping the wavelengths from λ− 0.45 nm through λ+0.45 nm will thus measure the optical signal throughout the range of any given wavelength, λ.

The value of the OSNR from these measurements is given by the following formula:

$$OSNR = \frac{V_{peak}}{\sum V_{non-peak}}$$

The value $V_{peak}$ gives the optical power in the signal channel.

The tuning of the refractive index in the tuning section is based upon the injection of charge in the form of the tuning current. Consequently, the tuning process is very fast. A single channel trace can be obtained very easily with 25 scans operating at a data rate of 1 MHz. This implies that reliable spectral measurement can be carried out in approximately 0.225 msec. (25 scans multiplied by 9 samples multiplied by 1 microsecond per sample; 225 microseconds or 0.225 msec.). Thus, the device provides a very compact means for rapidly measuring the OP and OSNR of an individual DWDM signal channel.

Obviously, in alternative embodiments, the samples could be taken at smaller or larger wavelength intervals, as may be desired to optimize system monitoring. As well, in other embodiments of the invention, the value of the OSNR can be taken using the average Vnon-peak in the denominator (as opposed to the aggregate Vnon-peak), calculated as follows:

$$OSNR = Vpeak / ((\Sigma Vnon\text{-}peak)/\text{number of non-peak samples})$$

Determination of the number of samples to be taken, the wavelength intervals at which such samples are centered, as well as the algorithm for calculating the OSNR from these measurements, can be determined by the user, as specific conditions may dictate to facilitate optimization of signals in a given network.

It is assumed that the optical input signal to the device is a single channel signal in a DWDM system. This signal is obtainable from the mixed DWDM signal by means of a variety of filters, or coarse tuning devices, as is well known in the art. Thus such devices have not been described herein.

FIG. 4 depicts an exemplary deployment of the device and method of the invention. The device is used at various points in the optical signal path of an optical communications system. What is shown is the switching functionality of such an optical communications system. The system accomplishes regeneration and reshaping at the input side of the switch fabric 410, and regeneration, reshaping and retiming at the output side of the switch fabric 410. The switch fabric has two redundant switches 410A and 410B, to insure fail safe operation. To properly monitor the input signal 400, the incoming signal 400 is monitored as to performance by an OPM 450. As well, at the output of each switch the signal output from that switch is additionally monitored by OPMs 450A and 450B. The switch with the best signal output is used, or alternatively, a default switch is used until the signal performance output from it drops below certain defined thresholds.

The chosen signal is fed through the 3R regenerator 430, and the signal output from the 3R regenerator 430 is again monitored by OPM 450-OUT. The measurements of the various OPMs described are fed to the system control 475 (the connections to the system controller are not shown in FIG. 4) for real time decision making.

Using the method and apparatus of the present invention, a higher resolution method of monitoring signal strength and quality in optical networks emerges. The emerging all optical data network does not employ any O-E-O, or Optical to Electrical to Optical conversion whatsoever. Thus, the data only exists as modulations of an optical carrier signal. Large numbers of these individual signals are multiplexed for transmission between network nodes, such as in the now ubiquitous DWDM method (multiplexing 40, 80, and even larger numbers of individual carrier wavelengths). Therefore, in order to adequately monitor signal strength and OSNR, it is simply not sufficient to monitor that of the mixed, or multiplexed, signal, but rather each and every single channel signal must be monitored as well. This can be now accomplished in a quick and expeditious manner.

Where simultaneous measurements of the signal power and OSNR are necessitated, a parallel array of the devices of the present invention, equal to the number of single DWDM channels in the system, can be utilized. Where sufficient time exists to not require absolute simultaneous monitoring of all of the incoming signals, either the device of the present invention can be successively fed different wavelength signals, or, using the natural middle ground combining parallel and series topographies, an array with a number of devices less than the total number of DWDM wavelengths can each be input a number of single channel signals successively.

Applicants' invention has been described above in terms of specific embodiments. It will be readily appreciated by one of ordinary skill in the art, however, that the invention is not limited to those embodiments, and that, in fact, the principles of the invention may be embodied and practiced in other devices and methods. Therefore, the invention should not be regarded as delimited by those specific embodiments but by the following claims.

What is claimed is:

1. A semiconductor photodetector device comprising:
   a substrate of a first doping type;
   an updoped region, laterally disposed above the substrate;
   a waveguide laterally disposed above the updoped region for passing light therethrough;
   a grating with a tunable effective index positioned between the substrate and the updoped region for reflecting one or more wavelengths of said light;
   an upper region, of a second doping type, laterally disposed above the waveguide region;
   an absorption section positioned above said upper region for absorbing said reflected wavelengths and generating a photocurrent from said absorbed wavelengths;
   a tuning section for changing said effective index of said grating so that only a particular wavelength is selected to be reflected and therefore absorbed by said absorption section.

2. The device of claim 1, where, above the upper region is laterally disposed an absorption region comprising:
   an absorption layer;
   an updoped region of a different atomic composition than the absorption layer laterally disposed above the absorption region; and
   a metallic diffusion layer laterally disposed above the updoped region;
   where the absorption region is centered on, and of a width approximately 20–25% that of, the device of claim 1.

3. The device of claim 1, where the substrate, updoped region, and upper region are made of InP.

4. The device of claim 3, where, above the upper region is laterally disposed an absorption region comprising:
   an absorption layer;
   an undoped region of a different atomic composition than the absorption layer laterally disposed above the absorption region; and
   a metallic diffusion layer laterally disposed above the undoped region;
   where the absorption region is centered on, and of a width approximately 20–25% that of, the device of claim 3.

5. The device of claim 3, where the waveguide is composed of InGaAsP.

6. The device of claim 5, where, above the upper region is laterally disposed an absorption region comprising:
   an absorption layer;
   an undoped region of a different atomic composition than the absorption layer laterally disposed above the absorption region; and a metallic diffusion layer laterally disposed above the undoped region;

where the absorption region is centered on, and of a width approximately 20–25% that of, the device of claim 5.

7. The device of any of claim 2, 4, 10 or 6, where within the absorption region the absorption layer is made of InGaAs, and the undoped layer of InP.

8. The device of any of claims 1–6, further comprising:

a metallic diffusion region in a portion of said upper region; and a tuning contact in electric communication with said metallic diffusion.

9. The device of claim 1, where the waveguide is composed of InGaAsP.

10. The device of claim 9, where, above the upper region is laterally disposed an absorption region comprising:

an absorption layer;

an updoped region of a different atomic composition than the absorption layer laterally disposed above the absorption region; and a metallic diffusion layer laterally disposed above the updoped region;

where the absorption region is centered on, and of a width approximately 20–25% that of, the device of claim 9.

11. The semiconductor photodetector of claim 1 wherein said tuning section comprises an electrode, and said effective index is changed by changing an electrical current injected into said electrode.

12. The semiconductor photodetector of claim 1 wherein said absorption section comprises an electrode for generating said photocurrent from said absorbed wavelengths.

* * * * *